(12) United States Patent
Trimberger et al.

(10) Patent No.: US 7,240,320 B1
(45) Date of Patent: Jul. 3, 2007

(54) ROUTING WITH DERIVATIVE FRAME AWARENESS TO MINIMIZE DEVICE PROGRAMMING TIME AND TEST COST

(75) Inventors: Stephen M. Trimberger, San Jose, CA (US); Austin H. Lesea, Los Gatos, CA (US); Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 261 days.

(21) Appl. No.: 10/989,679

(22) Filed: Nov. 16, 2004

(51) Int. Cl.
 *G06F 17/50* (2006.01)
(52) U.S. Cl. .......................................... 716/16; 716/17
(58) Field of Classification Search ............ 716/16–18, 716/1, 2
 See application file for complete search history.

(56) References Cited

U.S. PATENT DOCUMENTS

| | | | | |
|---|---|---|---|---|
| 6,078,735 A | * | 6/2000 | Baxter | 716/3 |
| 6,629,308 B1 | * | 9/2003 | Baxter | 716/16 |
| 7,024,651 B1 | * | 4/2006 | Camilleri et al. | 716/12 |
| 7,073,158 B2 | * | 7/2006 | McCubbrey | 716/17 |

OTHER PUBLICATIONS

U.S. Appl. No. 10/966,643, filed Oct. 15, 2004, Young et al.

* cited by examiner

*Primary Examiner*—Jack Chiang
*Assistant Examiner*—Binh Tat
(74) *Attorney, Agent, or Firm*—E. Eric Hoffman; Kevin T. Cuenot; Michael R. Hardaway (57) ABSTRACT

A method of implementing a design on a programmable logic device (PLD) includes generating a database that identifies correspondence between resources and programming frames of the PLD. A first PLD design is compiled, wherein the first design uses a first set of resources in a first manner. Costs associated with using the first set of resources of the first design in the first manner are reduced. A second PLD design is then compiled, applying the reduced costs associated with using the first set of resources. A second set of resources required to compile the second design is identified, wherein the second set of resources is not used in the same manner as the first set of resources. A set of programming frames associated with the second set of resources is identified. Costs associated with using a third set of resources associated with the set of programming frames are increased.

16 Claims, 6 Drawing Sheets

ROUTING WITH DERIVATIVE FRAME AWARENESS TO MINIMIZE DEVICE PROGRAMMING TIME AND TEST COST

FIELD OF THE INVENTION

The present invention relates to an improved scheme for configuring a programmable logic device. More specifically, the present invention relates to a method for minimizing the size of a configuration bit stream necessary to configure a programmable logic device.

RELATED ART

Figure 1:
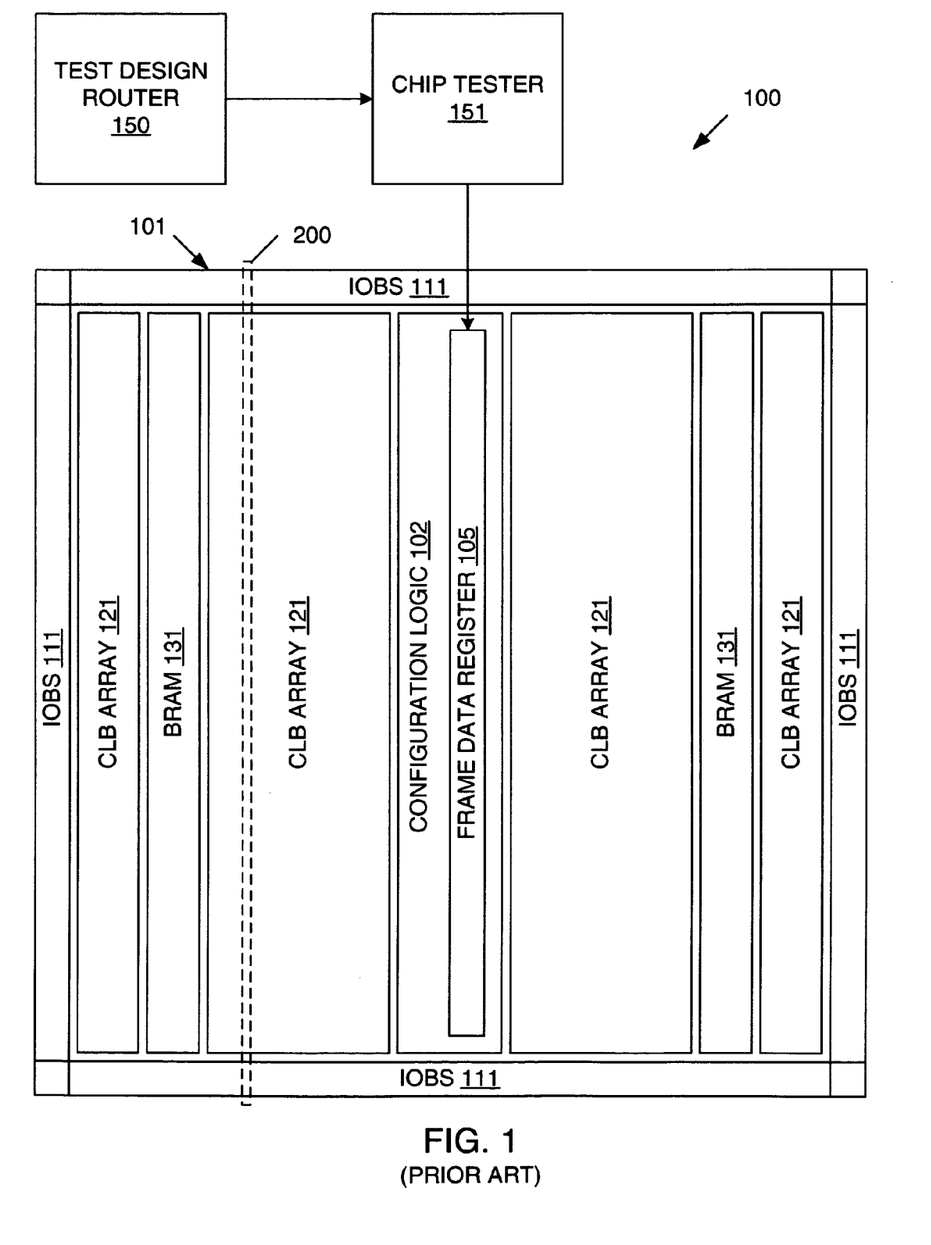
FIG. 1 is a block diagram of a conventional programmable logic system.

FIG. 1 is a block diagram of a conventional programmable logic system 100 in accordance with one embodiment of the present invention. Programmable logic system 100 includes programmable logic device 101, test design router 150, and chip tester 151. In the described embodiment, programmable logic device 101 is a field programmable gate array (FPGA), which includes configuration logic 102, a plurality input/output blocks (IOBs) 111 located around the periphery of the device or in complete rows or columns, an array of configurable logic blocks (CLBs) 121 arranged in rows and columns, and a plurality of block RAM (BRAM) elements 131 that extend along the column direction of CLB array 121. Configuration logic 102 includes a frame data register (FDR) 105. Clock resources and a programmable routing structure (not shown) are also located on programmable logic device 101. An associated configuration memory array (not shown) is loaded with configuration data values, which configure the above-described elements of programmable logic device 101. The configuration data values are loaded into the configuration memory array via configuration logic 101 in the manner described below. The above-described elements of programmable logic device 101 can be found in a conventional Virtex™-II FPGA, which is available from Xilinx, Inc., 2100 Logic Drive, San Jose, Calif. 95124.

Figure 2:
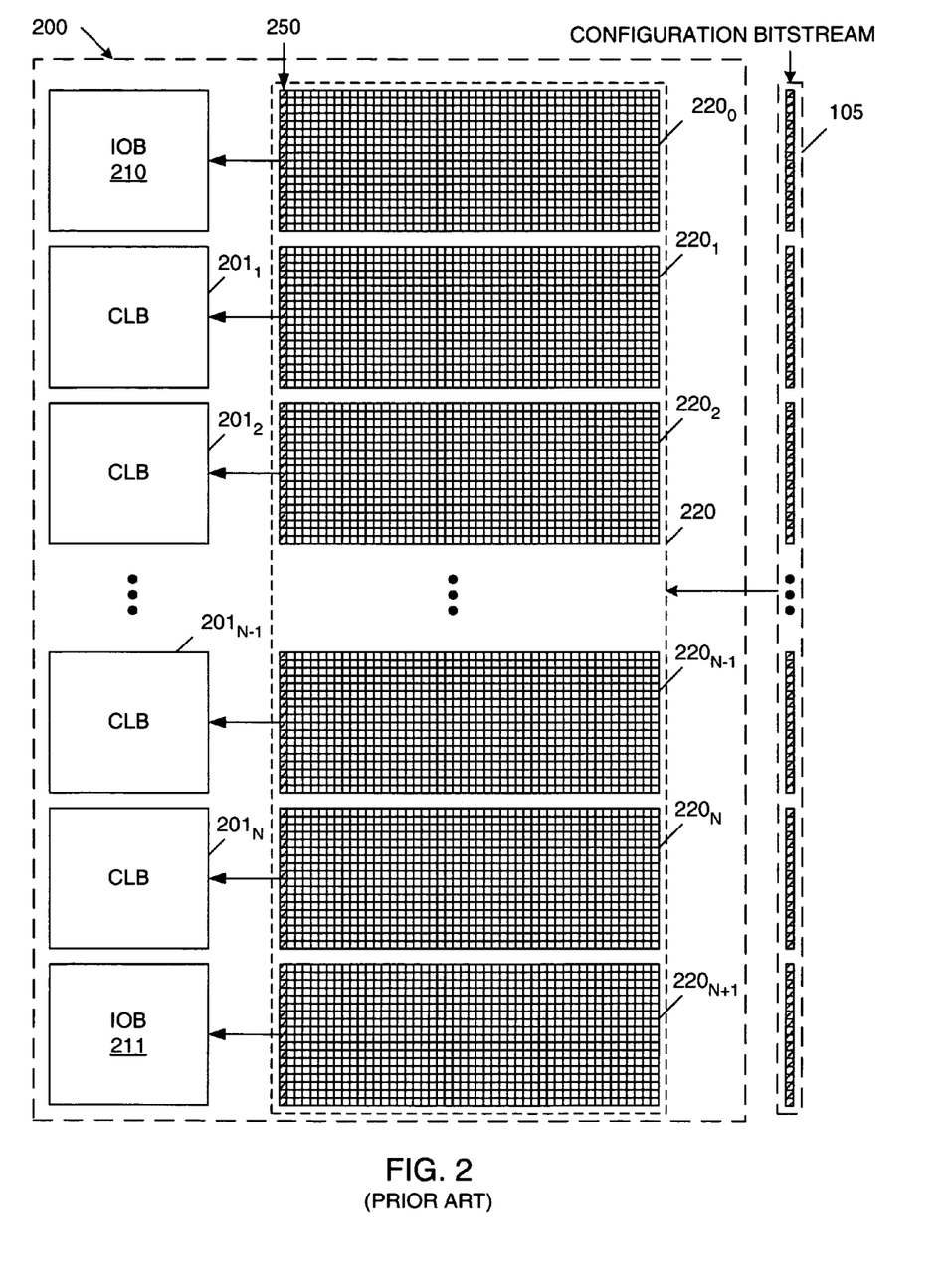
FIG. 2 is a block diagram of a frame data register and a section of a programmable logic device, which includes a column of CLBs, a top IOB, a bottom IOB, and the associated configuration memory array section.

FIG. 2 is a block diagram of frame data register 105 and a section 200 of programmable logic device 101, which includes a column of CLBs $201_1$–$201_N$, a top IOB 210, a bottom IOB 211, and the configuration memory array section 220 associated with CLBs $201_1$–$201_N$ and IOBs 210–211. Section 200 is illustrated in dashed lines in FIG. 1. Configuration memory array section 220 includes a plurality of configuration memory array subsections $220_0$–$220_{N+1}$. In the described embodiment, which is based on the Xilinx Virtex™-II FPGA described in Xilinx Application Note XAPP151, each configuration memory array subsection includes 18 rows and 48 columns of configuration memory cells, wherein each configuration memory cell stores a corresponding configuration bit. Each configuration memory cell controls an associated programmable interconnection point (PIP) in the associated CLB or IOB. Each of the configuration memory array subsections $220_0$–$220_{N+1}$ configures an associated IOB or CLB as illustrated. Note that in other embodiments, other dimensions are possible for the configuration memory array subsections $220_0$–$220_{N+1}$, and the number of memory cells required to configure an IOB may be different than the number of memory cells required to configure a CLB.

In the illustrated example, the configuration memory array is loaded on a column-by-column basis. An entire column of configuration data bits (hereinafter referred to as a programming frame) includes 18×(N+2) bits. One programming frame of configuration data bits is illustrated by shaded column 250 in FIG. 2. Each programming frame of configuration data bits includes (N+2) sub-frames, each having a width of 18-bits. Test design router 150 generates a test design bitstream, which is stored in chip tester 151. During configuration, configuration data bits are transmitted from chip tester 151 into frame data register 105, until frame data register 105 stores a full programming frame of configuration data bits. The programming frame of configuration data bits is then simultaneously shifted out of frame data register 105 into an addressed column of the configuration memory array (e.g., into column 250 of configuration memory array section 220). This process is repeated until the entire configuration memory array is loaded with the desired configuration memory bits. Chip tester 151 then supplies test stimulus to the FPGA and checks the response for correct operation.

A typical configuration bit stream can include 1 million or more configuration data bits. As a result, a large external memory is required to store the configuration bit stream. In addition, it takes a relatively long time to load such a large bit stream. For example, it may take about 10 milliseconds to load a configuration bit stream having 1 million configuration data bits.

In order to test programmable logic device 101 after fabrication, the programmable logic device 101 is configured to implement a plurality of different designs. Each of the programmed designs is tested to ensure that the programmable logic device operates properly. The designs and tests are selected to ensure that all available resources (logic and routing) of the programmable logic device are functional. The cost of testing the programmable logic device is based on the amount of time required to successfully run all of the test designs. The largest portion of the total test time is associated with configuring the programmable logic device. Consequently, it is desirable to reduce the time required to configure the programmable logic device.

Programmable logic device 101 may support a reduced configuration bit stream size, wherein a programming frame containing all logic zero configuration bits is not written to a previously reset programmable logic device 101. A programming frame will typically have all logic zero configuration bits if the resources associated with the programming frame are not used in a particular design. A programming frame containing all logic zero configuration bits does not need to be written to the configuration memory array, because the configuration memory array was initially reset to store all logic zero bits. This option is referred to as a "Don't Write Zero Frames" (DWZF) option.

More generally, programmable logic device 101 may support a reduced configuration bit stream size, wherein a programming frame is not written to the programmable logic device if the desired contents of the programming frame are unchanged from the previous contents of that programming frame. This option is referred to as a generalized DWZF option.

General-purpose routers, such as test design router 150, have typically been used to route test designs on the programmable logic device 101. These routers use a minimal set of routing resources on the FPGA to route the desired interconnection network. The configuration bit streams generated by the routers can include identical programming frames over different test designs, due to minimal resource usage on the FPGA. However, these identical programming frame values are the result of chance, because the router has no information identifying the resources associated with each programming frame of the configuration bit stream.

It would therefore be desirable to have a scheme for controlling the routing of a series of test designs to maximize the number of unmodified configuration bits from one test design to the next. That is, it is desirable for each test bit stream to substantially match the previous test bit stream. Thus, when used in a test flow that includes several test bit streams loaded into the same FPGA serially, the changes from one bit stream to the next bit stream are minimized. This would advantageously minimize the required configuration bit stream size and the programming time of the associated programmable logic device. It would also be desirable to reduce the cost associated with testing a programmable logic device.

SUMMARY

Accordingly, the present invention provides an improved method of implementing designs on a programmable logic device, which includes the following steps. A database is generated that identifies the correspondence between resources of the programmable logic device and the programming frames of the programmable logic device that control the resources. A first design of the programmable logic device is compiled, wherein the first design uses a first set of resources in a first manner. Costs associated with using the first set of resources in the first manner are then reduced. A second design of the programmable logic device is then compiled, applying the reduced costs associated with using the first set of resources in the first manner.

A second set of resources required to compile the second design can be identified, wherein the second set of resources is not used in the same manner as the first set of resources. A set of programming frames associated with the second set of resources is identified. The costs associated with using a third set of resources associated with the identified set of programming frames are then increased. The compiling of the second design then continues, applying both the remaining reduced costs associated with using the first set of resources, and the increased costs associated with using the third set of resources.

In the foregoing manner, the second design is compiled in a manner that maximizes the use of resources used in the first design. As a result, the number of programming frames that do not have to be reprogrammed to implement the second design is maximized.

The step of compiling the first design may include routing interconnect networks associated with the first design, and the step of compiling the second design may include routing interconnect networks associated with the second design. In one embodiment, the present invention reduces bit stream size for test designs used in device verification. A smaller configuration bit stream requires less time to configure the programmable logic device and/or allows the use of less expensive test equipment, thereby leading to lower testing costs. Note that the programming time for a test design represents a large portion of the cost of testing the programmable logic device.

Test designs tend to have self-repeating patterns. Thus, the routing implemented on a small programmable logic device in accordance with the present invention can be used as a template for the routing implemented on a large programmable logic device in the same device family. Thus, the large programmable logic device benefits from the same matching programming frames as the small programmable logic device, which was used to create the routing template.

In another embodiment, the present invention can be used in connection with a user design, to reduce the configuration time and/or allow a smaller configuration ROM to be used. In general, the present invention can be used in any application where a smaller configuration bit stream is advantageous.

In accordance with another embodiment, the overall test time is reduced by ordering the test configurations to minimize the number of changed programming frames from one configuration to the next. This ordering can be performed by implementing frame-by-frame comparisons, thereby obtaining a difference value between each pair of configuration bit streams. These bit stream pairs are sorted by the number of matches. The bit stream pair having the most matches is selected to form a run of bit streams. This process continues, with the unused bit stream pair having the next most matches being used to form a new run, being added to an existing run, or being used to merge two runs. Runs are equally valid in either order, the order of runs can be reversed in order to merge the runs in an optimal manner. When a bit stream is ordered in the middle of a run, all the bit stream pairs associated with this bit stream are removed from the list of bit stream pairs. When there are no more bit stream pairs, all runs are concatenated, and the remaining bit streams are added to the sequence arbitrarily. Other optimization algorithms can be applied in other embodiments.

The present invention will be more fully understood in view of the following description and drawings.

DETAILED DESCRIPTION

The present invention provides a method for routing a plurality of designs on a programmable logic device with "frame awareness", such that there are a maximum number of programming frames that are unchanged from a previous design to a current design. Since programming frames that are unchanged from design to design do not need to be re-programmed, the configuration bit stream size is reduced, thereby reducing programming time of the programmable logic device. In accordance with one embodiment, the unchanged programming frames are not re-programmed using a DWZF option.

In accordance with one embodiment, a wave front expansion router is used to implement the present invention. However, it is understood that any router may be used. For example, a router supporting a "rip-up and reroute" feature or a "shoving" feature can be used. Both of these features are well known, and are described in more detail by Michael J. Alexander, James P. Cohoon, Joseph L. Ganley and Gabriel Robins in "An Architecture-Independent Approach to FPGA Routing Based on Multi-Weighted Graphs", Association for Computer Machinery, ACM 0-89791-687-5/94/0009 (1994). Other routing methods may also be used, but the details of implementing the present invention may be different in these cases. The underlying router implementation details are not important to the present invention, so long as the router used has the ability to dynamically provide cost functions for routing resources and can reroute interconnect networks (nets) to reduce the overall resource cost. For example, the present invention may use a production router (which implements a place and route (PAR) program) to perform the routing. This PAR program need only be modified to provide an interface to cost routing or logic resources based on the programming frames impacted by these resources.

In order to maximize the number of unchanged programming frames from configuration to configuration, it is necessary to make the router preferentially use routing and/or logic resources that are the same as those used in a previously loaded design. The method for accomplishing this for routing can be generally defined as follows.

First, the routing resources of the programmable logic device are mapped to the programming frames, such that the mapping identifies which programming frames are affected by each routing resource. It is possible that some routing resources may affect multiple programming frames, depending on the implementation of the programmable logic device.

The previously loaded design is then provided to a test design router. The costs associated with using the routing resources of the previously loaded design are minimized or eliminated (i.e., set to zero).

A current design is then provided to the test design router. The interconnect networks associated with the current design are then routed, taking into account the reduced costs associated with the routing resources of the previously loaded design. The reduced costs associated with the routing resources of the previously loaded design encourage the use of the same routing resources by the test design router. If an interconnect network does not use a set of routing resources in the same way as the previously loaded design, then the resource costing function used by the router's cost based expansion is modified to highly cost all routing resources in the associated programming frames.

In the manner described above, the routing is accelerated by translating a subset of the routing resources (i.e., individual switches or PIPs) to preferred settings of paths in the router. This is accomplished by significantly lowering the resource cost of every switch (PIP) setting of the previous design. Once a programming frame contains different data than the previous bit stream, all resource costs associated with that programming frame revert to the normal value. The resource costs can be modified during the routing process, but may also be modified after each interconnect network is routed. The resource costs are used to choose the preferred route from the set of allowed routes in a pattern-based router. Preferred routing patterns use the connections from the previously loaded design.

It is advantageous to select preferred PIP settings rather than preferred whole interconnect networks, since interconnect networks typically span multiple programming frames, and it is unlikely that routing resources will be re-used in the same way if two interconnect networks are unrelated. Using preferred PIP settings allows the creation of more identical frames.

A base method, which can be used to route a design, while maximizing the number of re-used (matching) programming frames, is described in more detail below.

Figure 3:
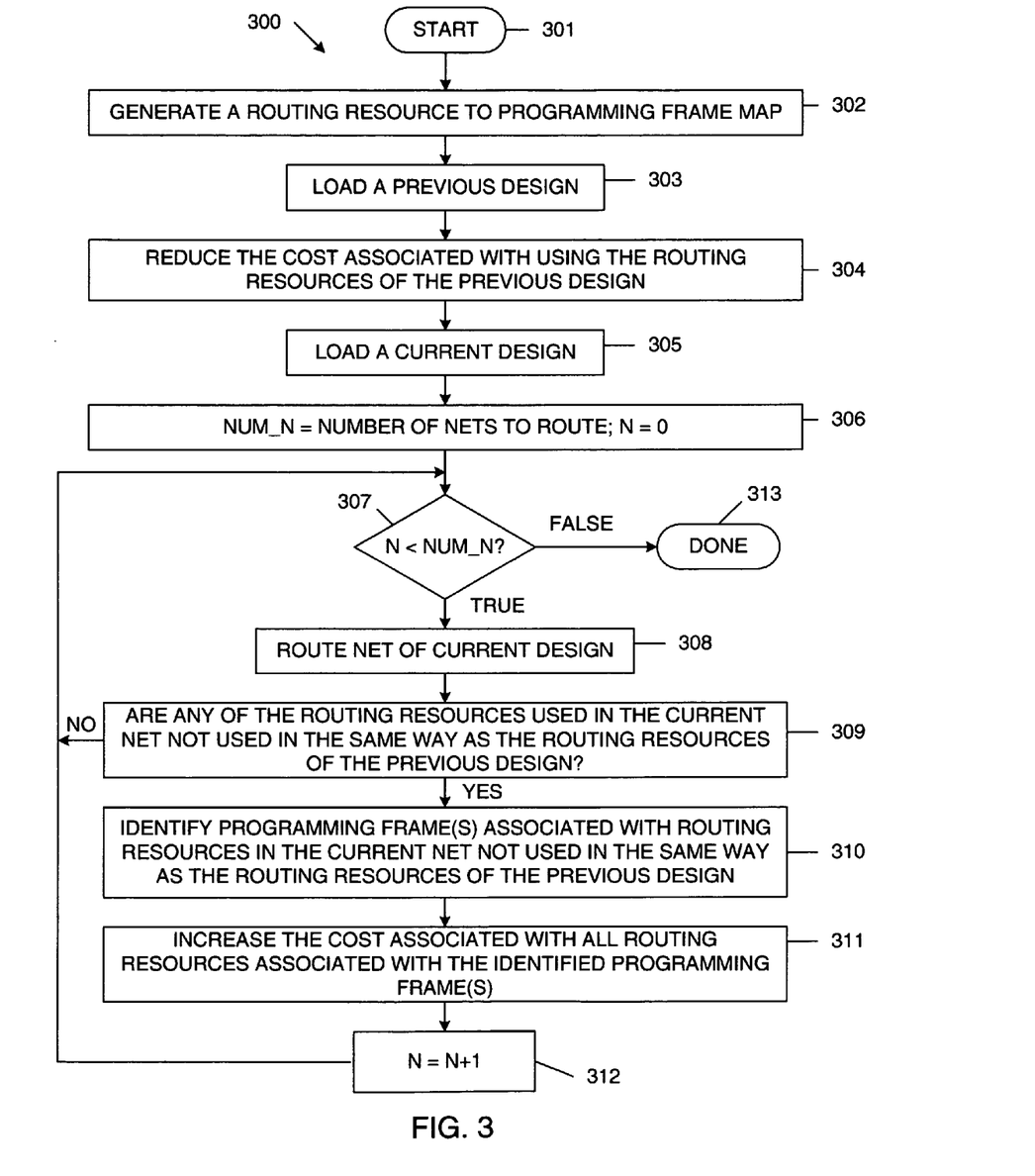
FIG. 3 is a flow diagram illustrating a base method of routing a design in accordance with one embodiment of the present invention.

FIG. 3 is a flow diagram illustrating a base method 300 of routing a design in accordance with one embodiment of the present invention.

After the method is started (Step 301), a router, such as router 150, generates a map that identifies the correspondence between the routing resources of the programmable logic device and the associated programming frames that control the routing resources (Step 302). A sufficiently fast function F is available to the router such that FrameId=F(r), where FrameId identifies a programming frame, and 'r' identifies a routing resource in the device model. For example, this map may indicate that a first set of routing resources is controlled by the contents of programming frame A. Note that the wave-front expansion router is considering routing resources and wants to know the programming frame with which the routing resources are associated. In the present embodiment, the router does not consider a programming frame and wants to know what resources are associated with that frame. However, in other embodiments, modifications to the method can be implemented in which the database would work in both directions.

Figure 4:
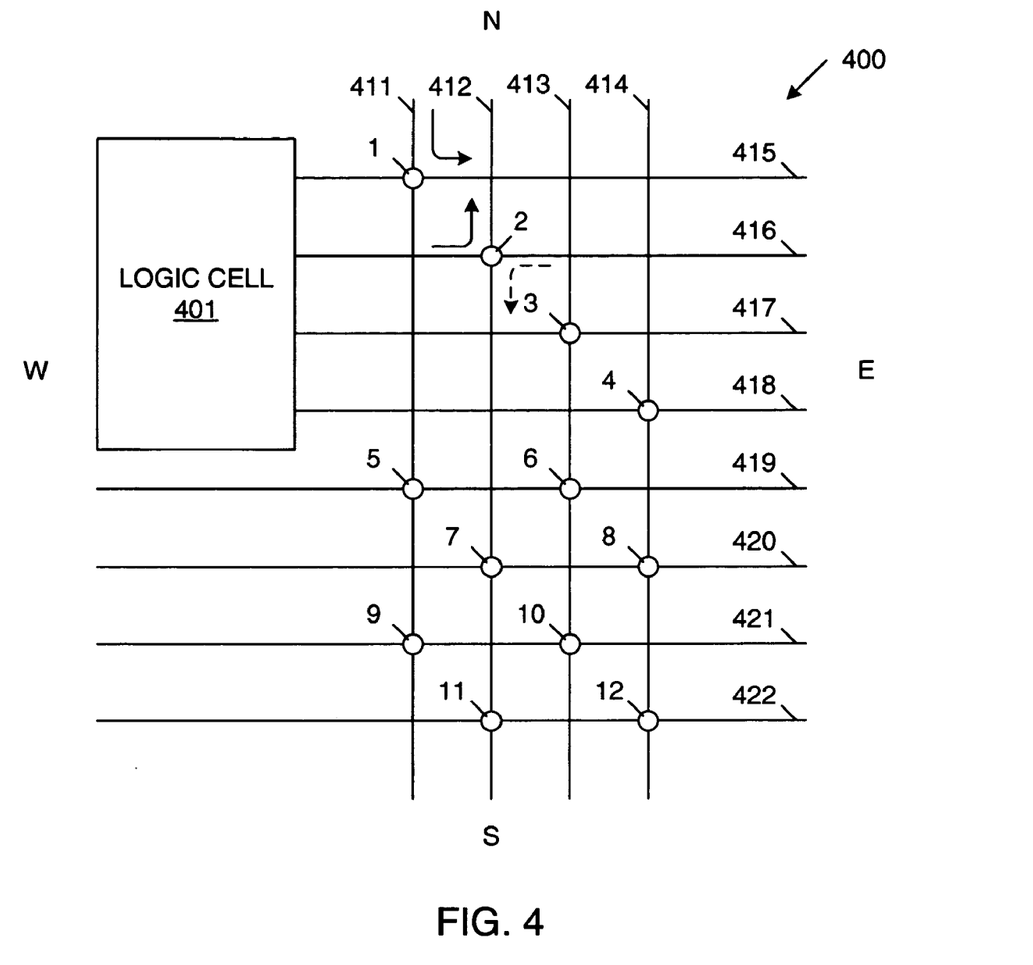
FIG. 4 is a block diagram that is used to illustrate the mapping of a set of routing resources to programming frames for a portion of a FPGA fabric in accordance with one embodiment of the present invention.

FIG. 4 is a block diagram of a portion of a representative FPGA fabric 400, including a logic cell 401, routing wires 411–422 and programmable routing resources (switches) 1–12. Routing resources 1–12 are controlled by configuration data bits in one of three programming frames, hereinafter identified as frames A, B and C. Note that there are many other routing resources and programming features (not shown), which are controlled by other bits in these programming frames. Table 1 below identifies which programming frame(s) contain the configuration bits that control the programming of each of the routing resources 1–12. Note that it is possible for one routing resource to be controlled by bits in multiple programming frames.

TABLE 1

Routing Resource to Programming Frame Association

| Routing Resource ID | Programming Frame(s) |
|---|---|
| 1 | A, C |
| 2 | A, C |
| 3 | B |
| 4 | B |
| 5 | C |
| 6 | B |
| 7 | C |
| 8 | B |
| 9 | C |
| 10 | B |
| 11 | C |
| 12 | B |

The design previously loaded into programmable logic device 101 is loaded into router 150 (Step 303). The router 150 then reduces the costs associated with the use of routing resources used in the previously loaded design (Step 304). For example, if switch 1 in FIG. 4 is set to connect wire 411 North to wire 415 East and switch 2 is set to connect wire 416 West to wire 412 North (arrows in FIG. 4), then the costs in the router are lowered to use those same connections in the same way. In a particular embodiment, router 150 eliminates the costs associated with the use of these routing resources.

A current design is then loaded into router 150 (Step 305).

The number of interconnect networks (i.e., nets) to be routed in the design is specified as the value NUM_N (Step 306). A current net value N, which identifies the current interconnect network being routed, is initially set to zero (Step 306). If the current net value N is less than the number of interconnect networks NUM_N in the design (Step 307, True branch), then the current interconnect network (identified by current net value N) is routed, taking into account the reduced costs associated with routing resources of the previously loaded design (Step 308). This routing may be implemented using a maze routing technique, which is known to those of ordinary skill in the art. In one embodiment, this maze routing technique may include rip-up and reroute functions. After the current interconnect network has been routed, the router 150 determines whether any of the routing resources used in the current interconnect network are not used in the same way as the routing resources of the previously routed design (Step 309). If there the routing resources used in the current interconnect network are used in the same way as the routing resources of the previous design (Step 309, NO branch), then processing returns to Step 307. However, if there are routing resource used in the current interconnect network that are not used in the same way as the routing resources of the previous design (Step 309, YES branch), then router 150 identifies the programming frame(s) associated with the routing resources of the current interconnect network that are not used in the same way as the routing resources of the previous design (Step 310). Router 150 then increases the cost of all routing resources associated with the programming frame(s) identified in Step 310. For example, if the router chose a path from routing wire 416 East to routing wire 412 South (dashed arrow in FIG. 4), then the resources would not be used identically, so features associated with both frame A and C would have their costs revert to the higher cost.

The current net value N is then incremented (Step 312), and processing continues with Step 307. If the current net value N is not less than the total number of interconnect networks NUM_N in the design (Step 307, false branch), then the process is complete for the current design (Step 313).

In accordance with the present embodiment, only programming frames associated with routing resources that are changed from the previous design need to be written to the configuration memory cells of the programmable logic device. Programming frames associated with routing resources that are used identically to the previous design do not need to be written to the configuration memory cells of the programmable logic device These programming frames are those that still have reduced costs at the end of the routing process. These programming frames can be not written using a generalized Don't Write Zero Frames option. The above-described method will reduce configuration bit stream size and programming time, thereby reducing device test cost.

The enhancements described below can further reduce run time and/or configuration bit stream size.

In another variation, the cost of the initial use of a programming frame is selected in view of the versatility of the routing resources associated with the programming frame. More specifically, programming frames associated with more versatile routing resources are assigned a lower cost, thereby promoting the use of these routing resources.

As a result, programming frames associated with more versatile routing resources are more likely to be used, thereby reducing the overall programming frame usage. Note that in this variation, all programming frames are not equal. Some programming frames contain resources that are more versatile in routing even though it may take more routing resources to route the interconnect networks. For example, it may be optimal to use programming frames associated with double length routing resources than programming frames associated with hex length routing resources because of the superior flexibility of the double length routing resources. Note that this variation is very specific to the routing of the device being configured.

In another variation, the user may know that certain programming frames should never be used. If programming frame usage is disallowed for these programming frames, then a run time optimization is possible since the routing algorithm will not need to visit this routing at all. It is design specific as to whether fewer programming frames are used. Placement may be improved similarly by lowering the placement cost in the placer for logic resources used identically.

In the above embodiments, the order of the designs is known in advance and used to increase the number of matching frames. In some applications, all bitstreams are known in advance, but their order is not fixed. In accordance with another embodiment, an FPGA router is provided with a plurality of configuration bit streams, wherein each configuration bit stream represents a corresponding test design to be implemented by the FPGA. The FPGA router then selects the order in which the configuration bit streams will be loaded into the FPGA. As described in more detail below, this order is selected to maximize the number of matching programming frames in consecutively loaded configuration bit streams. It is desirable to have such matching programming frames, because if a programming frame of the configuration bit stream to be loaded has the same bit pattern and usage as the corresponding programming frame of a currently stored configuration bit stream, it is not necessary to reload this programming frame. Thus, the programming time associated with the next configuration bit stream can be reduced.

Figure 5:
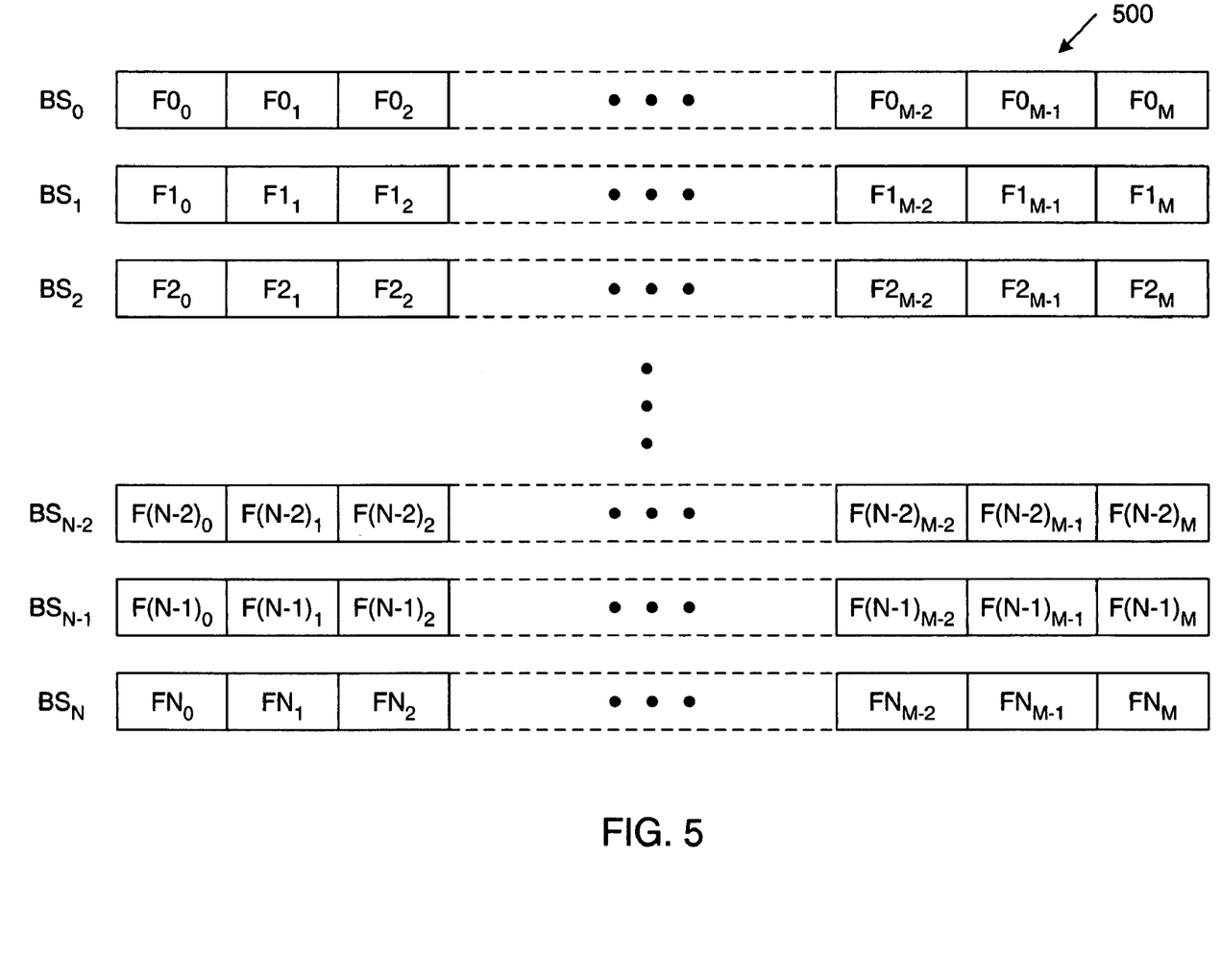
FIG. 5 is a block diagram illustrating a plurality of configuration bit streams, which are processed in accordance with one embodiment of the present invention.

FIG. 5 is a block diagram illustrating a set 500 of (N+1) configuration bit streams $BS_0$–$BS_N$, which are used to configure an associated FPGA during test mode. Each of the configuration bit streams $BS_0$–$BS_N$ includes a corresponding plurality (M+1) of programming frames and instructions (not shown). More specifically, configuration bit stream $BS_X$ includes programming frames $FX_0$–$FX_M$, where X is any integer between 0 and M.

Each programming frame in each configuration bit stream $BS_0$–$BS_N$ is compared with corresponding programming frames in each of the other configuration bit streams $BS_0$–$BS_N$. For example, programming frames $F0_0$–$F0_M$ of configuration bit stream $BS_0$ are compared with corresponding programming frames $F1_0$–$F1_M$ of configuration bit stream $BS_1$. The number of matching frames (as described below in connection with FIG. 6) in configuration bit streams $BS_0$–$BS_1$ is recorded. This process is repeated, with each possible pair of configuration bit streams being compared. Table 2 below shows a possible result if N is equal to 5.

TABLE 2

| Bit Stream Pair | # of Matching Frames |
| --- | --- |
| $BS_0$ and $BS_1$ | 5 |
| $BS_0$ and $BS_2$ | 37 |
| $BS_0$ and $BS_3$ | 15 |
| $BS_0$ and $BS_4$ | 20 |
| $BS_0$ and $BS_5$ | 0 |
| $BS_1$ and $BS_2$ | 35 |
| $BS_1$ and $BS_3$ | 30 |
| $BS_1$ and $BS_4$ | 25 |
| $BS_1$ and $BS_5$ | 17 |
| $BS_2$ and $BS_3$ | 8 |
| $BS_2$ and $BS_4$ | 4 |
| $BS_2$ and $BS_5$ | 37 |
| $BS_3$ and $BS_4$ | 22 |
| $BS_3$ and $BS_5$ | 41 |
| $BS_4$ and $BS_5$ | 50 |

The configuration bit streams are then sorted by the number of matches. The configuration bit streams having the largest number of matches are sorted into a run. Thus, in the example of Table 2, configuration bit streams $BS_4$ and $BS_5$ (having 50 matching frames) are placed together in a run. Runs are equally valid in either order. Thus, the possible run orders at this time would be ($BS_4$, $BS_5$) or ($BS_5$, $BS_4$).

This sorting is continued, with unused pairings having the greatest number of matches either forming a new run, adding to a run, or merging two runs. Thus, in the example of Table 2, configuration bit streams $BS_3$ and $BS_5$ (having 41 matching frames) are placed together in a run. Thus, the possible run orders at this time would be ($BS_4$, $BS_5$, $BS_3$) or ($BS_3$, $BS_5$, $BS_4$). When a bit stream, such as bit stream $BS_5$ in the present example, is in the middle of a run, all of the associated pairings ($BS_0$ and $BS_5$, $BS_1$ and $BS_5$, $BS_2$ and $BS_5$) are removed from further consideration.

Continuing the example of Table 2, the remaining configuration bit stream pairs, $BS_0$ and $BS_2$ have the largest number of matching frames (i.e., 37). Because neither of these bit streams $BS_0$ nor $BS_2$ is common with any of the bit streams in the existing run (i.e., $BS_3$, $BS_4$ and $BS_5$), these bit streams $BS_0$ and $BS_2$ form a new run having possible run orders of ($BS_0$, $BS_2$) or ($BS_2$, $BS_0$).

Continuing the example of Table 2, the remaining configuration bit stream pairs, $BS_1$ and $BS_2$ have the largest number of matching frames (i.e., 35). Thus, configuration bit stream $BS_1$ is added to the run that includes bit streams $BS_0$ and $BS_2$. Thus, the possible orders of this run would be ($BS_0$, $BS_2$, $BS_1$) or ($BS_1$, $BS_2$, $BS_0$). Because bit stream $BS_2$ is in the middle of this run, all of the associated pairings ($BS_2$ and $BS_3$, $BS_2$ and $BS_4$) are removed from further consideration.

Of the remaining bit stream pairs, $BS_1$ and $BS_4$ have the largest number of matching frames (i.e., 25). Thus, the run including configuration bit stream $BS_1$ is merged with the run including configuration bit stream $BS_4$. Thus, the possible orders of this merged run would be ($BS_0$, $BS_2$, $BS_1$, $BS_4$, $BS_5$, $BS_3$) or ($BS_3$, $BS_5$, $BS_4$, $BS_1$, $BS_2$, $BS_0$). Either of these merged runs would maximize the number of matching frames when loading configuration bit streams $BS_0$–$BS_5$.

The determination of matching frames will now be described in more detail.

Figure 6:
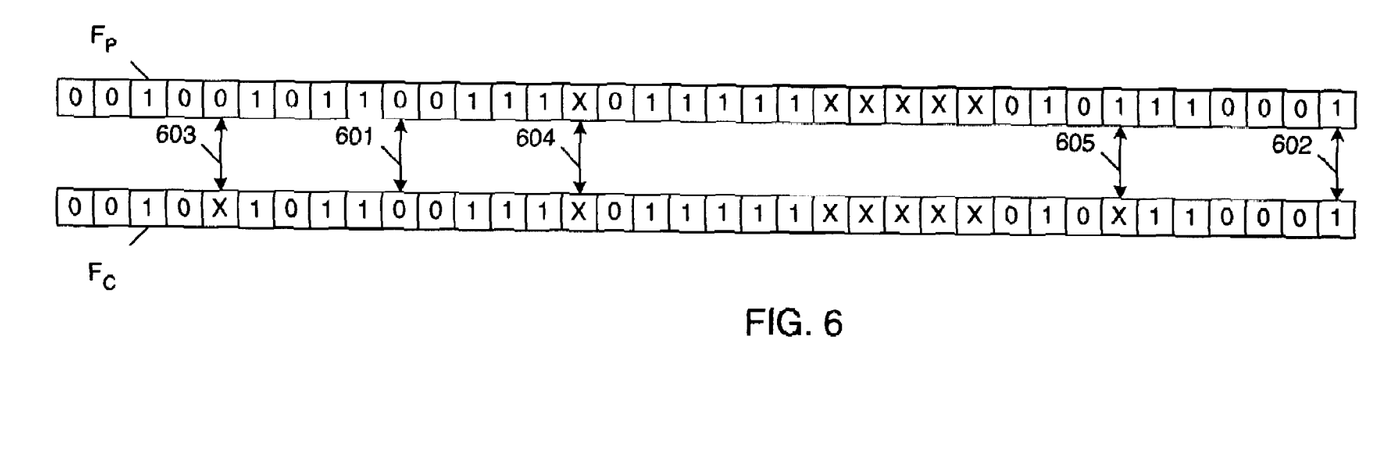
FIG. 6 is a block diagram illustrating a comparison of a current programming frame with a previous programming frame in accordance with one embodiment of the present invention.

FIG. 6 is a block diagram illustrating a pair of corresponding programming frames $F_P$ and $F_C$, wherein programming frame $F_P$ is from a previous design and programming frame $F_C$ is from a current design. Although each of these programming frames $F_P$ and $F_C$ has 36-bits in the present example, it is understood that actual programming frames typically include many more bits. As illustrated, bits of the programming frames (frame bits) can be in any one of three states: "used" and set to a logic "1" value, "used" and set to a logic "0" value, and "unused" (represented by an "X" value). Each frame bit in the current programming frame $F_C$ is compared with the corresponding frame bit in the previous programming frame $F_P$. If the frame bit in the current programming frame $F_C$ is a "used" frame bit having the same value as the corresponding frame bit in the previous programming frame $F_P$, then a match is detected for this frame bit. Lines 601 and 602 illustrate matching "used" frame bits in programming frames $F_C$ and $F_P$. If the frame bit in the current programming frame $F_C$ is an "unused" frame bit, a match is detected for this frame bit, regardless of the state of the corresponding frame bit in the previous programming frame $F_P$. Lines 603–605 illustrate matching "unused" frame bits in programming frames $F_C$ and $F_P$. Note that a non-matching condition may be detected if there is an "unused" frame bit in the previous programming frame $F_P$ and a "used" frame bit in the current programming frame $F_C$. Thus, the number of matching frames may be different depending on the order of the sequences of bit streams. In this case, Table 2 would be increased in size to accommodate different matches for the different order.

If a "match" is detected for each of the frame bits in programming frames $F_C$ and $F_P$, then these programming frames are identified as matching programming frames. The count of matching frames may be adjusted to account for the overhead cost in terms of configuration bits and time for transmitting non-contiguous frames of data.

Although a particular method of ordering the bit streams has been provided, there are many other possible ordering methods that could be applied in other embodiments of the present invention.

In addition, although the present invention has been described in connection with a particular programmable logic device 101, it is understood that the present invention can be applied to many different types of programmable logic devices. For example, the present invention can be applied to programmable logic devices having layout structures different than the structure illustrated in FIG. 1. For example, although the programmable logic device 101 of FIG. 1 illustrates IOBs 111 located around the periphery of the device, it is understood that these IOBs can be distributed in rows or columns of the programmable logic device. In addition, it is understood that the programmable logic device can include other programmable structures, such as multi-gigabit transceivers, configuration and clocking logic, digital signal processing blocks, digital clock managers, analog-to-digital converters, system monitoring logic, and dedicated processor blocks. It is further understood that these circuit elements can have various arrangements on the programmable logic device.

In addition, although the present invention has been described in connection with the determination of routing interconnect networks, it is understood that the previously loaded design can be used as a guide file for implementing synthesis (i.e., the implementation of Boolean logic) and placement (i.e., locating the Boolean logic in the CLBs), thereby biasing these tasks to create more similarity between the previously loaded design and the current design.

Although the invention has been described in connection with several embodiments, it is understood that this invention is not limited to the embodiments disclosed, but is capable of various modifications, which would be apparent to one of ordinary skill in the art. For example, although the present invention has described a programming frame as including a full column of configuration data bits, it is understood that a programming frame can be defined to include less than a full column of configuration data bits. For example, a programming frame may include one or more sub-frames of configuration data bits. Thus, the present invention is only intended to be limited by the following claims.

We claim:

1. A method of implementing a design on a programmable logic device comprising:
   compiling a first design of the programmable logic device, wherein the first design is implemented using a first set of programming frames;
   compiling a second design of the programmable logic device; and
   generating a second set of programming frames of a bit stream for the second design, wherein the second design is compiled to maximize the number of common programming frames in the first and second sets of programming frames, and wherein the number of common programming frames in the first and second sets of programming frames is maximized by:
   generating a database that identifies the correspondence between resources of the programmable logic device and programming frames of the programmable logic device that control the resources; identifying a first set of resources used in a first manner in the first design; reducing costs associated with using the first set of resources of the first design in the first manner; and applying the reduced costs associated with using the first set of resources of the first design in the first manner when compiling the second design.

2. The method of claim 1, wherein the step of compiling the first design comprises routing interconnect networks associated with the first design, and wherein the step of compiling the second design comprises routing interconnect networks associated with the second design.

3. The method of claim 2, wherein the steps of routing the interconnect networks comprise implementing maze routing.

4. The method of claim 3, wherein the maze routing comprises rip-up and re-routing.

5. The method of claim 1, further comprising:
   identifying a second set of resources required to compile the second design, wherein the second set of resources is not used in the same manner as the first set of resources;
   identifying a set of programming frames associated with the second set of resources; and
   increasing costs associated with using a third set of resources associated with the set of programming frames.

6. The method of claim 5, further comprising: compiling the second design of the programmable logic device, applying the reduced costs associated with using the first set of resources of the first design, and applying the increased costs associated with using the third set of resources.

7. A system for implementing a design on a programmable logic device comprising:
   means for compiling a first design of the programmable logic device, wherein the first design is implemented using a first set of programming frames;
   means for compiling a second design of the programmable logic device and generating a second set of programming frames of a bit stream for the second design; and
   means for maximizing the number of common programming frames in the first and second sets of programming frames the means for maximized comprising:
   means for generating a database that identifies the correspondence between resources of the programmable logic device and programming frames of the programmable logic device that control the resources; mean for identifying a first set of resources used in a first manner in the first design; mean for reducing costs associated with using the first set of resources of the first design in the first manner; and mean for applying the reduced costs associated with using the first set of resources of the first design in the first manner when compiling the second design.

8. The system of claim 7, wherein the means for compiling the first design comprise means for routing interconnect networks associated with the first design, and wherein the means for compiling the second design comprise means for routing interconnect networks associated with the second design.

9. The system of claim 8, wherein the means for routing the interconnect networks comprise means for implementing maze routing.

10. The system of claim 9, wherein the means for implementing maze routing comprise means for implementing rip-up and re-routing.

11. The system of claim 7, further comprising:
    means for identifying a second set of resources required to compile the second design, wherein the second set of resources is not used in the same manner as the first set of resources;
    means for identifying a set of programming frames associated with the second set of resources; and
    means for increasing costs associated with using a third set of resources associated with the set of programming frames.

12. The system of claim 11, further comprising: means for compiling the second design of the programmable logic device, applying the reduced costs associated with using the first set of resources of the first design, and applying the increased costs associated with using the third set of resources.

13. A method of implementing a plurality of designs on a programmable logic device comprising:
    identifying a plurality of configuration bit streams to be loaded into the programmable logic device;
    selecting an order for loading the configuration bit streams into the programmable logic device, wherein the order is selected to maximize the number of matching programming frames in consecutively loaded configuration bit streams; and
    loading the programmable logic device using the plurality of configuration bit streams according to the order wherein maximizing the number of matching programming frames comprises: generating a database that identifies the correspondence between resources of the programmable logic device and programming frames of the programmable logic device that control the resources; identifying a first set of resources used in a first manner in the first design; reducing costs associated with using the first set of resources of the first design in the first manner; and applying the reduced costs associated with using the first set of resources of the first design in the first manner when compiling the second design.

14. The method of claim 13, wherein the step of selecting comprises comparing programming frames in a first configuration bit stream with programming frames in a second configuration bit stream.

15. A method of implementing a plurality of designs on a programmable logic device comprising:
   identifying a plurality of configuration bit streams to be loaded into the programmable logic device;
   selecting an order for loading the configuration bit streams into the programmable logic device, wherein the order is selected to minimize the time required to load the plurality of configuration bit streams; and
   loading the programmable logic device using the plurality of configuration bit streams according to the order wherein maximizing the number of matching programming frames comprises: generating a database that identifies the correspondence between resources of the programmable logic device and programming frames of the programmable logic device that control the resources; identifying a first set of resources used in a first manner in the first design; reducing costs associated with using the first set of resources of the first design in the first manner; and applying the reduced costs associated with using the first set of resources of the first design in the first manner when compiling the second design.

16. The method of claim 15, wherein the step of selecting comprises calculating a time for loading the configuration bit streams based on the time required for the programmable logic device to process bit stream commands.

* * * * *